United States Patent
Nishimura et al.

(10) Patent No.: US 11,327,411 B2
(45) Date of Patent: *May 10, 2022

(54) SUBSTRATE PROCESSING APPARATUS AND ARTICLE MANUFACTURING METHOD

(71) Applicant: CANON KABUSHIKI KAISHA, Tokyo (JP)

(72) Inventors: Mitsuhide Nishimura, Utsunomiya (JP); Kenichi Kamino, Utsunomiya (JP); Kashu Matsumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/320,464

(22) Filed: May 14, 2021

(65) Prior Publication Data

US 2021/0271177 A1 Sep. 2, 2021

Related U.S. Application Data

(63) Continuation of application No. 16/812,717, filed on Mar. 9, 2020, now Pat. No. 11,048,176.

(30) Foreign Application Priority Data

Mar. 15, 2019 (JP) .............................. JP2019-048747

(51) Int. Cl.
*G03F 7/20* (2006.01)
*G05B 19/042* (2006.01)
(Continued)

(52) U.S. Cl.
CPC ........ *G03F 7/70725* (2013.01); *G03F 7/7085* (2013.01); *G03F 7/70775* (2013.01);
(Continued)

(58) Field of Classification Search
CPC ............. G03F 7/70725; G03F 7/70775; G03F 7/7085; G03F 7/7075; G03F 7/707;
(Continued)

(56) References Cited

U.S. PATENT DOCUMENTS 7,692,763 B2 4/2010 Kihara
10,373,852 B2 * 8/2019 Yamamoto .............. B08B 3/041
(Continued)

FOREIGN PATENT DOCUMENTS

| JP | 2006269867 A | 10/2006 |
| JP | 2008135499 A | 6/2008 |
| JP | 2017108169 A | 6/2017 |

OTHER PUBLICATIONS

Extended European Search Report issued in European Appln. No. 20159784.6 dated Aug. 6, 2020.
(Continued)

*Primary Examiner* — Peter B Kim
(74) *Attorney, Agent, or Firm* — Rossi, Kimms & McDowell LLP

(57) ABSTRACT

The present invention provides a substrate processing apparatus that processes a substrate, the apparatus including a stage configured to hold and move the substrate, a conveying unit configured to hold and convey the substrate between conveying unit and the stage, an accumulation unit configured to accumulate control information concerning the stage and the conveying unit which is generated by processing the substrate, and a determination unit configured to determine a conveying procedure when conveying the substrate between the stage and the conveying unit by selecting one of a plurality of conveying procedures which can be set for the stage and the conveying unit based on control information accumulated in the accumulation unit.

12 Claims, 11 Drawing Sheets

(51) Int. Cl.
*H01L 21/027* (2006.01)
*H01L 21/68* (2006.01)
*H01L 21/687* (2006.01)

(52) U.S. Cl.
CPC ........ *G05B 19/042* (2013.01); *H01L 21/0274* (2013.01); *H01L 21/682* (2013.01); *H01L 21/68742* (2013.01); *G05B 2219/2621* (2013.01)

(58) Field of Classification Search
CPC ............. G03F 7/70708; G03F 7/70691; G03F 7/70733; G03F 7/20; G05B 2219/2621; G05B 19/042; G05B 19/41815; H01L 21/0274; H01L 21/682; H01L 21/68742; H01L 21/67745; H01L 21/67276; H01L 21/67011; H01L 21/681; H01L 21/67748; H01L 21/68
See application file for complete search history.

(56) References Cited

U.S. PATENT DOCUMENTS

| | | |
|---|---|---|
| 11,048,176 B2* | 6/2021 | Nishimura ............ G03F 7/7085 |
| 2002/0089655 A1 | 7/2002 | Kida |
| 2005/0135903 A1 | 6/2005 | Rice |
| 2005/0275998 A1 | 12/2005 | Kamono |
| 2008/0143996 A1 | 6/2008 | Hirano |
| 2011/0007296 A1 | 1/2011 | Hirano |
| 2011/0141448 A1 | 6/2011 | Aoki |
| 2019/0378734 A1 | 12/2019 | Ehrne |

OTHER PUBLICATIONS

Search Report and Written Opinion issued in SG Appln. No. 10202002354U dated Dec. 3, 2020.
Office Action issued in U.S. Appl. No. 16/812,717 dated Oct. 6, 2020.
Notice of Allowance issued in U.S. Appl. No. 16/812,717 dated Mar. 17, 2021.

* cited by examiner

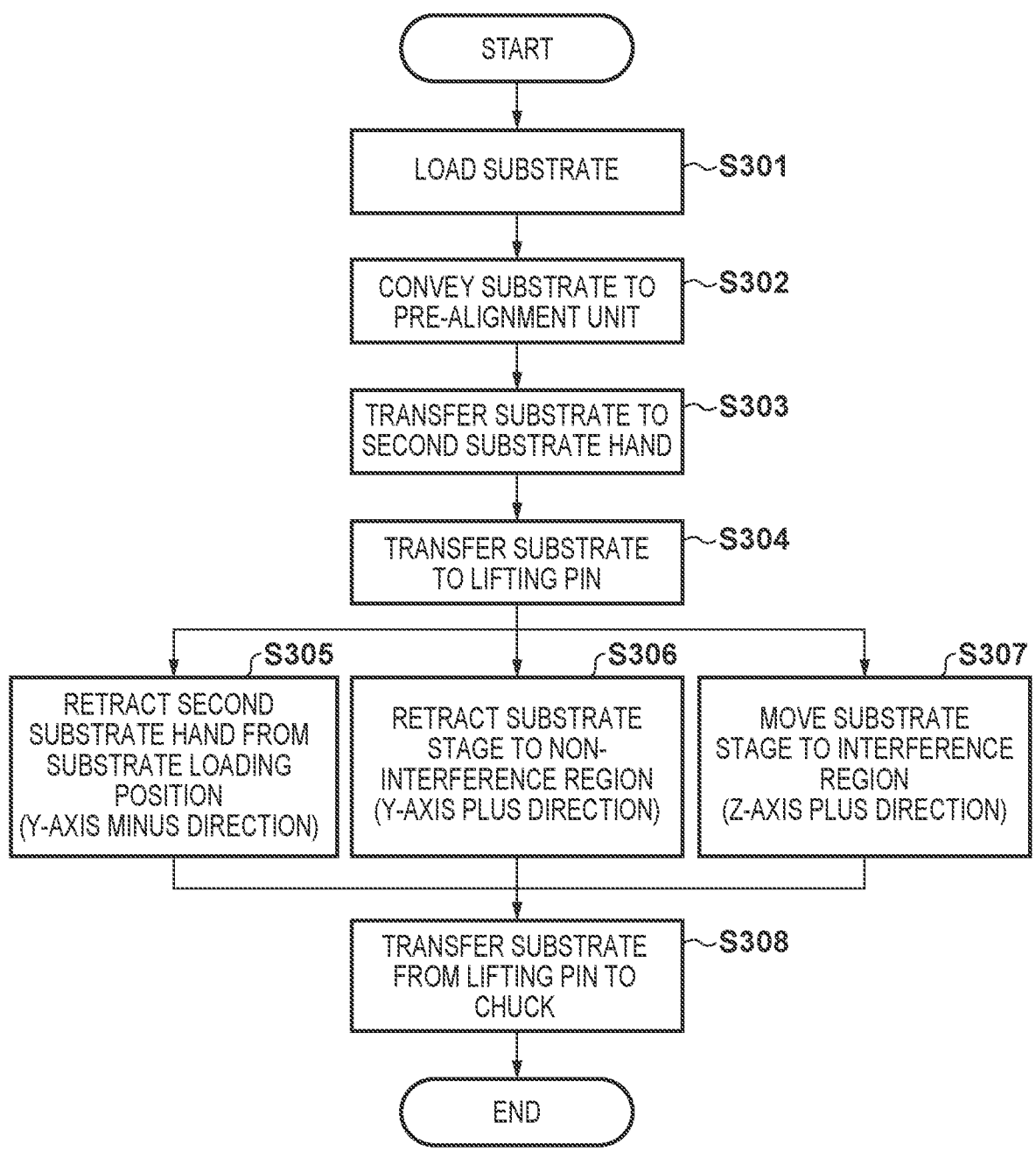

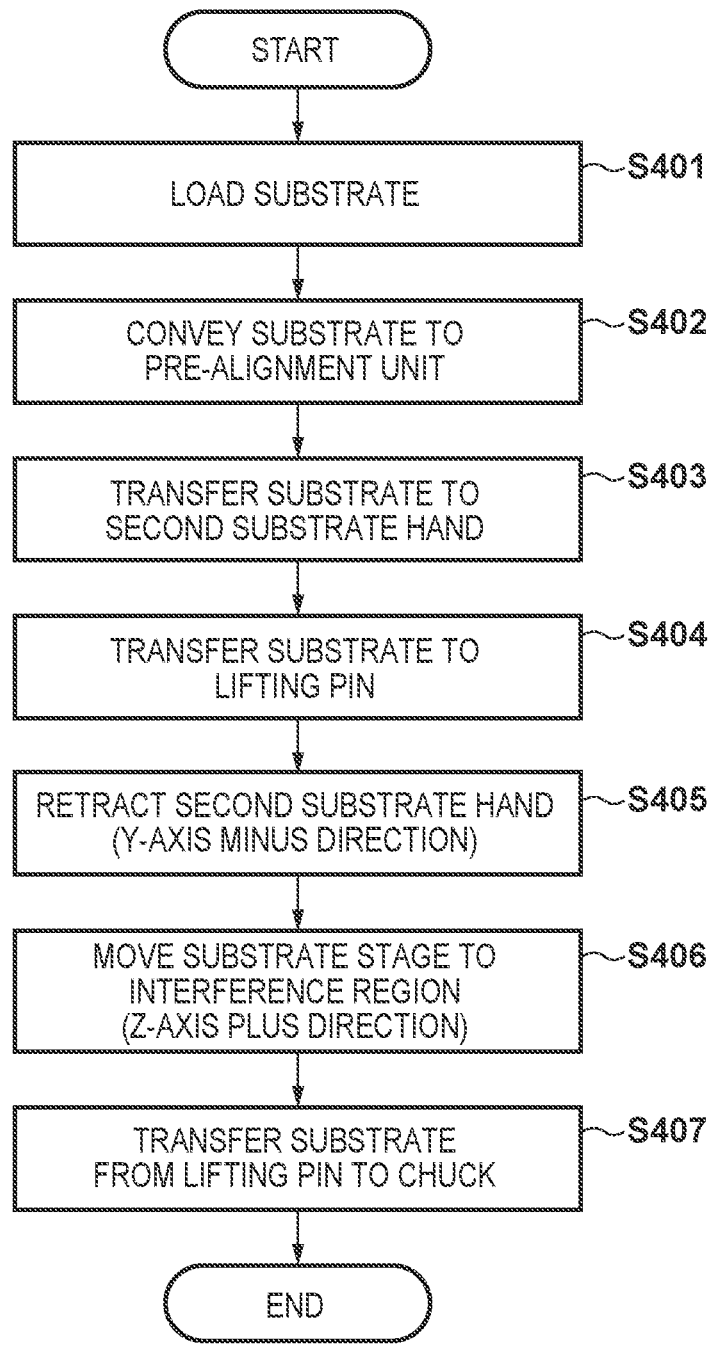

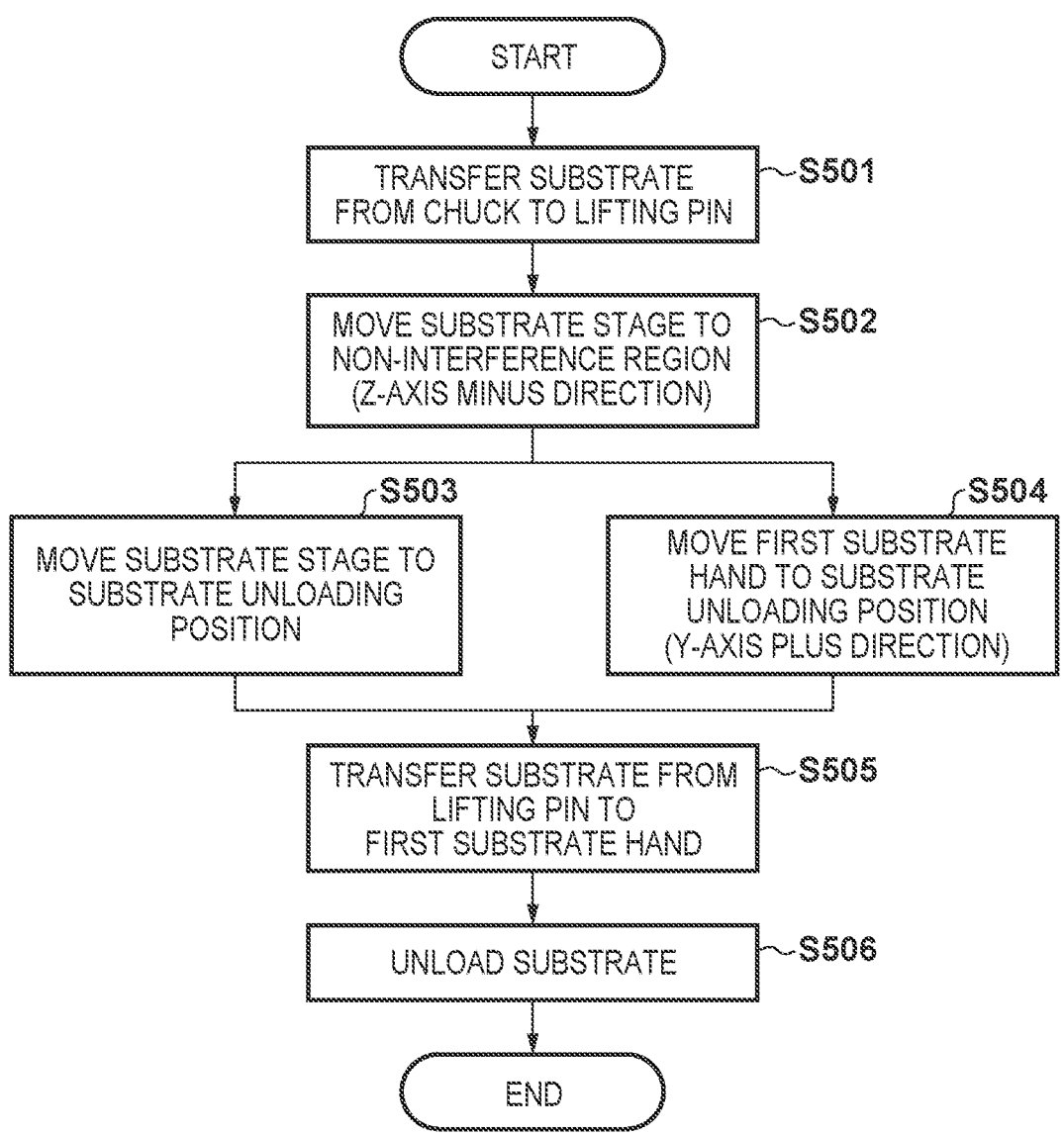

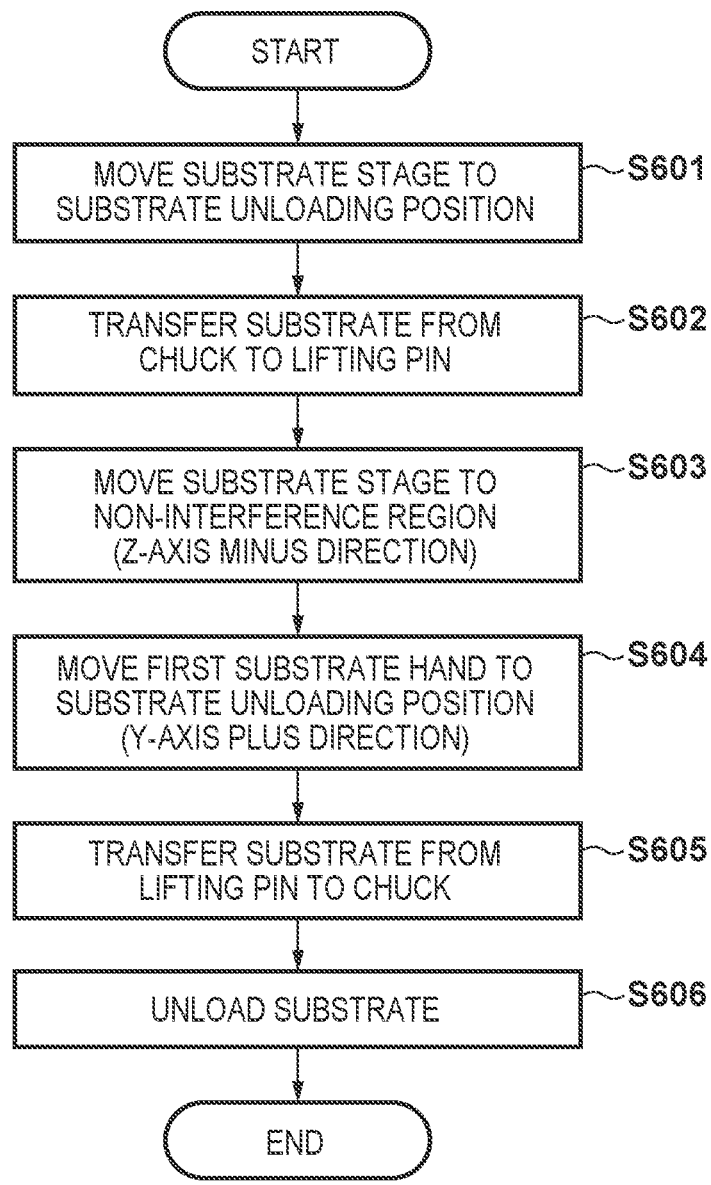

FIG. 9

| | Threshold | Count Threshold(Lot) | Change Seq. |
|---|---|---|---|
| Chuck Vac. Value(Load) | *** ~702 | *** ~703 | *** ~704 |
| Chuck Vac. Time(Load) | *** ~705 | *** ~706 | *** ~707 |
| Pin Vac. Value(Load) | *** ~708 | *** ~709 | *** ~710 |
| Pin Vac. Time(Load) | *** ~711 | *** ~712 | *** ~713 |
| Alignment Value | *** ~714 | *** ~715 | *** ~716 |
| Alignment Error Times | | *** ~717 | *** ~718 |
| Chuck Vac. Value(Unload) | *** ~719 | *** ~720 | *** ~721 |
| Chuck Vac. Time(Unload) | *** ~722 | *** ~723 | *** ~724 |
| Pin Vac. Value(Unload) | *** ~725 | *** ~726 | *** ~727 |
| Pin Vac. Time(Unload) | *** ~728 | *** ~729 | *** ~730 |

| | Error No. | Count Threshold(Lot) | Change Seq. |
|---|---|---|---|
| Monitor Error | *** ~731 | *** ~732 | *** ~733 |
| | *** | *** | *** |
| | ⋮ | ⋮ | ⋮ |

| First Time Seq. | *** ~734 |
|---|---|

| Judge Mode | Threshold ☐ ~741 | AI ☐ ~742 | | |
|---|---|---|---|---|
| | Threshold | Count Threshold(Lot) | Change Seq. | |
| Chuck Vac. Value(Load) | *** ~702 | *** ~703 | *** ~704 | |
| Chuck Vac. Time(Load) | *** ~705 | *** ~706 | *** ~707 | |
| Pin Vac. Value(Load) | *** ~708 | *** ~709 | *** ~710 | |
| Pin Vac. Time(Load) | *** ~711 | *** ~712 | *** ~713 | |
| Alignment Value | *** ~714 | *** ~715 | *** ~716 | |
| Alignment Error Times | | *** ~717 | *** ~718 | |
| Chuck Vac. Value(Unload) | *** ~719 | *** ~720 | *** ~721 | |
| Chuck Vac. Time(Unload) | *** ~722 | *** ~723 | *** ~724 | |
| Pin Vac. Value(Unload) | *** ~725 | *** ~726 | *** ~727 | |
| Pin Vac. Time(Unload) | *** ~728 | *** ~729 | *** ~730 | |
| | Error No. | Count Threshold(Lot) | Change Seq. | |
| Monitor Error | *** ~731 | *** ~732 | *** ~733 | |
| | ... | ... | ... | |
| First Time Seq. | *** ~734 | | | |

SUBSTRATE PROCESSING APPARATUS AND ARTICLE MANUFACTURING METHOD

BACKGROUND OF THE INVENTION

Field of the Invention

The present invention relates to a substrate processing apparatus and an article manufacturing method.

Description of the Related Art

With an increase in the variety of device manufacturing methods (processes) using exposure apparatuses, it is necessary to convey various types of substrates with high productivity (at high speed). The various types of substrates include, for example, a substrate with a large amount of warpage, a substrate having a reverse surface with low flatness, and a substrate having a reverse surface coated with a chemical agent or coating agent.

Japanese Patent Laid-Open Nos. 2006-269867 and 2017-108169 propose techniques concerning the conveyance of substrates. Japanese Patent Laid-Open No. 2006-269867 discloses a technique of conveying substrates with high productivity by changing drive parameters of the respective units of a conveying mechanism, the pressure (substrate chucking pressure) with which a substrate is chucked, and the like. Japanese Patent Laid-Open No. 2017-108169 discloses a technique of conveying substrates with high productivity by using dual conveying paths for substrates.

None of the conventional techniques is a technique that can automatically determine (select), on the apparatus side, optimal drive parameters, a substrate chucking pressure, a conveying path, and the like for each process with respect to various types of substrates.

According to Japanese Patent Laid-Open No. 2006-269867, it is necessary to provide a unit for measuring the amount of warpage of a substrate or grasp the amount of warpage of a substrate in advance. In addition, according to Japanese Patent Laid-Open No. 2006-269867, drive parameters of the respective units of the conveying mechanism and a substrate chucking pressure are determined from the amount of warpage of a substrate, but there is no consideration to the state of the reverse surface of the substrate. On the other hand, the technique disclosed in Japanese Patent Laid-Open No. 2017-108169 needs to provide two conveying paths (first and second conveying paths) in order to improve the productivity of substrate conveyance.

SUMMARY OF THE INVENTION

The present invention provides a substrate processing apparatus advantageous in determining a conveying procedure when conveying substrates.

According to one aspect of the present invention, there is provided a substrate processing apparatus for processing a substrate, the apparatus including a stage configured to hold and move the substrate, a conveying unit configured to hold and convey the substrate between conveying unit and the stage, an accumulation unit configured to accumulate control information concerning the stage and the conveying unit which is generated by processing the substrate, and a determination unit configured to determine a conveying procedure when conveying the substrate between the stage and the conveying unit by selecting one of a plurality of conveying procedures which can be set for the stage and the conveying unit based on control information accumulated in the accumulation unit.

Further aspects of the present invention will become apparent from the following description of exemplary embodiments with reference to the attached drawings.

BRIEF DESCRIPTION OF THE DRAWINGS

FIG. 5 is a flowchart for explaining a productivity-oriented procedure.

FIG. 6 is a flowchart for explaining a stability-oriented procedure.

FIG. 7 is a flowchart for explaining a conveying procedure prioritizing productivity at the time of the conveyance of substrates.

FIG. 8 is a flowchart for explaining a conveying procedure prioritizing stability at the time of the conveyance of substrates.

FIG. 9 is a view showing an example of a setting screen as a user interface.

FIG. 10 is a view showing an example of a setting screen as a user interface.

DESCRIPTION OF THE EMBODIMENTS

Figure 1:
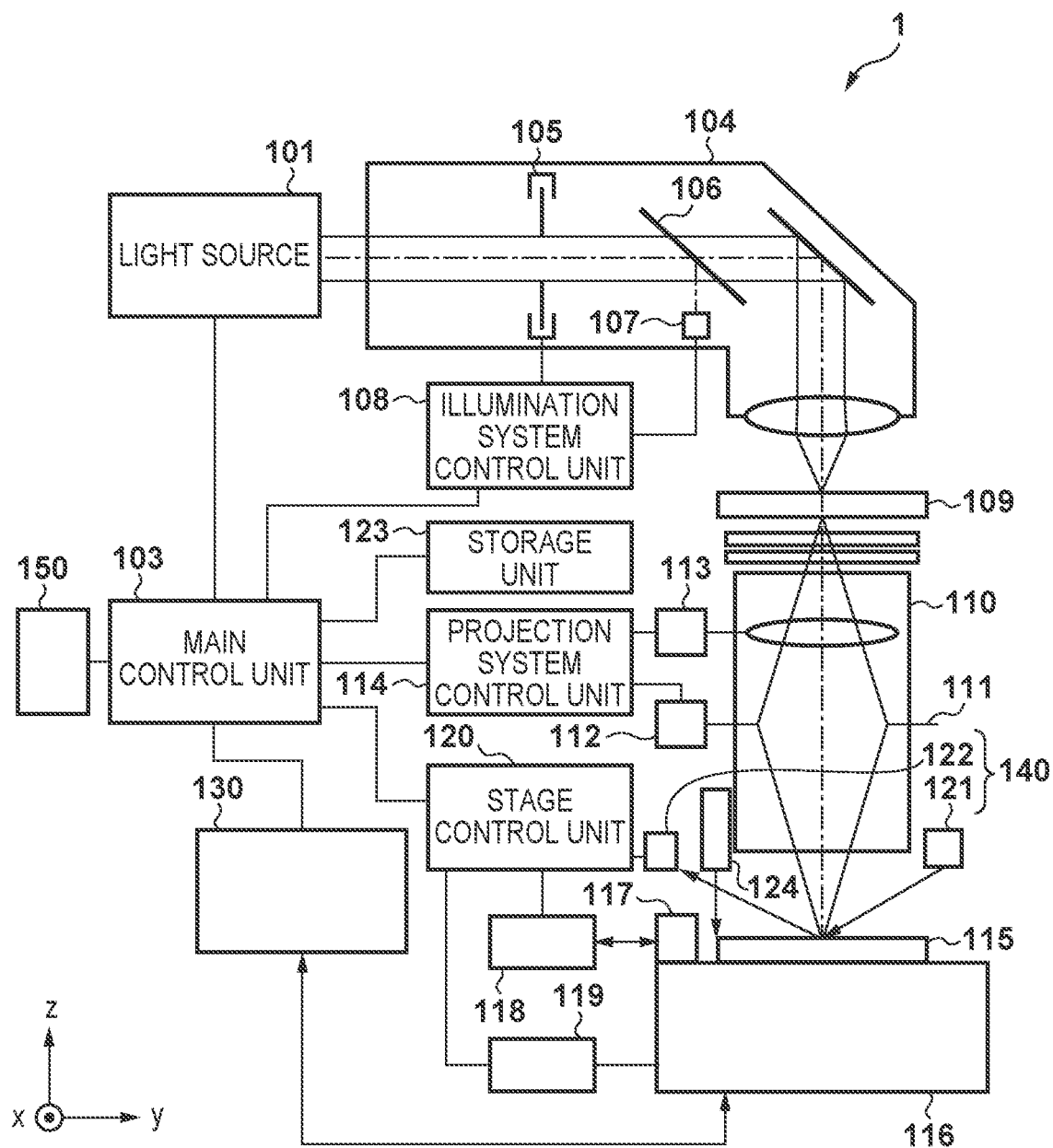
FIG. 1 is a schematic view showing the arrangement of an exposure apparatus according to one aspect of the present invention.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

FIG. 1 is a schematic view showing the arrangement of an exposure apparatus 1 according to one aspect of the present invention. The exposure apparatus 1 is a lithography apparatus used in a photolithography process as a manufacturing process for a device, and processes substrates. In this embodiment, the exposure apparatus 1 is implemented as a substrate processing apparatus that forms patterns on substrates. The exposure apparatus 1 exposes a substrate via a mask (original) by a step-and-scan system or step-and-repeat system and transfers a mask pattern onto the substrate.

Note that the present invention does not limit the substrate processing apparatus to an exposure apparatus and may also be applied to an imprint apparatus and a drawing apparatus. In this case, the imprint apparatus brings an imprint material supplied onto a substrate into contact with a mold, and applies curing energy to the imprint material to form a pattern on the cured material onto which a mold pattern is transferred. The drawing apparatus forms a pattern (latent image pattern) on a substrate by drawing on the substrate with a charged particle beam (electron beam) or laser beam. In addition, the present invention can be applied to apparatuses configured to process substrates, such as various types of high-precision processing apparatuses and various types of high-precision measurement apparatuses.

The exposure apparatus 1 includes an illumination optical system 104 that illuminates a mask 109 with light from a light source 101, a projection optical system 110, a first drive unit 112, a second drive unit 113, a substrate stage 116, a laser interferometer 118, and a third drive unit 119. The exposure apparatus 1 further includes an alignment measurement system 124, a focus measurement system 140, a main control unit 103, an illumination system control unit 108, a projection system control unit 114, a stage control unit 120, and a conveying unit 130.

The light source 101 emits (outputs) light in a plurality of wavelength bands as exposure light. The illumination optical system 104 further includes a shaping optical system (not shown) and an optical integrator (not shown). The illumination optical system 104 further includes a light-shielding plate 105, a half mirror 106, and a photosensor 107.

The light emitted from the light source 101 and entering the illumination optical system 104 is shaped into a predetermined shape via the shaping optical system. The light shaped by the shaping optical system enters the optical integrator. The optical integrator forms many secondary light sources for illuminating the mask 109 with a uniform illuminance distribution. The light-shielding plate 105 is arranged on the optical path of the illumination optical system 104 to form an arbitrary illumination region on the mask. The half mirror 106 is arranged on the optical path of the illumination optical system 104 to reflect (extract) part of light (exposure light) illuminating the mask 109. The photosensor 107 is arranged on the optical path of light reflected by the half mirror 106 to detect the intensity (exposure energy) of the light. The illumination system control unit 108 controls each unit (for example, the light-shielding plate 105) of the illumination optical system 104 under the control of the main control unit 103.

The mask 109 has a pattern to be transferred onto a substrate 115, that is, the circuit pattern of a semiconductor device, and is illuminated by the illumination optical system 104. The projection optical system 110 is formed from, for example, a refractive system or catadioptric system. The projection optical system 110 projects (forms) a pattern (its image) of the mask 109 onto the substrate 115 (one shot region of the substrate 115) coated with a photoresist (photosensitizing agent) at a predetermined magnification (for example, ½). The projection optical system 110 includes an aperture stop 111. The aperture stop 111 is arranged in the pupil plane of the projection optical system 110, that is, a Fourier transform plane corresponding to the mask 109, and includes an almost circular opening portion.

The first drive unit 112 includes a motor and sets a predetermined NA (numerical aperture) by controlling the diameter of the opening portion of the aperture stop 111. The second drive unit 113 drives (moves) an optical element constituting part of the lens system of the projection optical system 110 along the optical axis of the projection optical system 110. This makes it possible to suppress degradation in aberrations of the projection optical system 110 and reduce a distortion error while properly maintaining the projection magnification. A projection system control unit 114 controls the respective units of the projection optical system 110 (the aperture stop 111 and the optical elements) via the first drive unit 112 and the second drive unit 113 under the control of the main control unit 103.

As described above, the substrate 115 is a substrate onto which the pattern of the mask 109 is transferred (projected) and a photoresist is applied. The substrate 115 includes a wafer, a glass plate, and other types of substrates.

The substrate stage 116 is a stage that holds the substrate 115. The third drive unit 119 moves the substrate stage 116 in three-dimensional directions, that is, a direction (Z direction) along the optical axis of the projection optical system 110 and a plane (X-Y plane) orthogonal to the direction. The third drive unit 119 includes a motor for moving the substrate stage 116. In this embodiment, the direction along the optical axis of the projection optical system 110 is the Z direction (Z-axis), and the directions orthogonal to the optical axis of the projection optical system 110 are the X direction (X-axis) and the Y direction (Y-axis).

The laser interferometer 118 detects the distance to a mirror 117 fixed to the substrate stage 116 to measure the position of the substrate stage 116 in the X-Y plane. The alignment measurement system 124 measures a positional shift between the substrate 115 and the substrate stage 116. The stage control unit 120 moves the substrate stage 116 to a predetermined position in the X-Y plane via the third drive unit 119 based on the measurement result obtained by the laser interferometer 118 and the measurement result obtained by the alignment measurement system 124 under the control of the main control unit 103.

The focus measurement system 140 includes a projection optical system 121 and a detection optical system 122, and measures the position of the substrate 115 in the direction along the optical axis of the projection optical system 110, that is, the height of the surface of the substrate 115. The projection optical system 121 projects light (non-exposure light) that does not sensitize the photoresist applied on the substrate 115 and focuses the light at each position on the substrate 115. The light reflected at each position on the substrate 115 enters the detection optical system 122.

The detection optical system 122 has a plurality of light-receiving elements for position detection arranged in correspondence with light reflected at each position on the substrate 115. More specifically, the plurality of light-receiving elements for position detection are arranged such that the light-receiving surface of each light-receiving element is almost conjugate to each position (each reflection point) on the substrate 115 via an imaging optical system. Accordingly, the positional shift of the substrate 115 in the direction along the optical axis of the projection optical system 110 is measured as the positional shift of light entering each light-receiving element arranged on the detection optical system 122.

Figure 2:
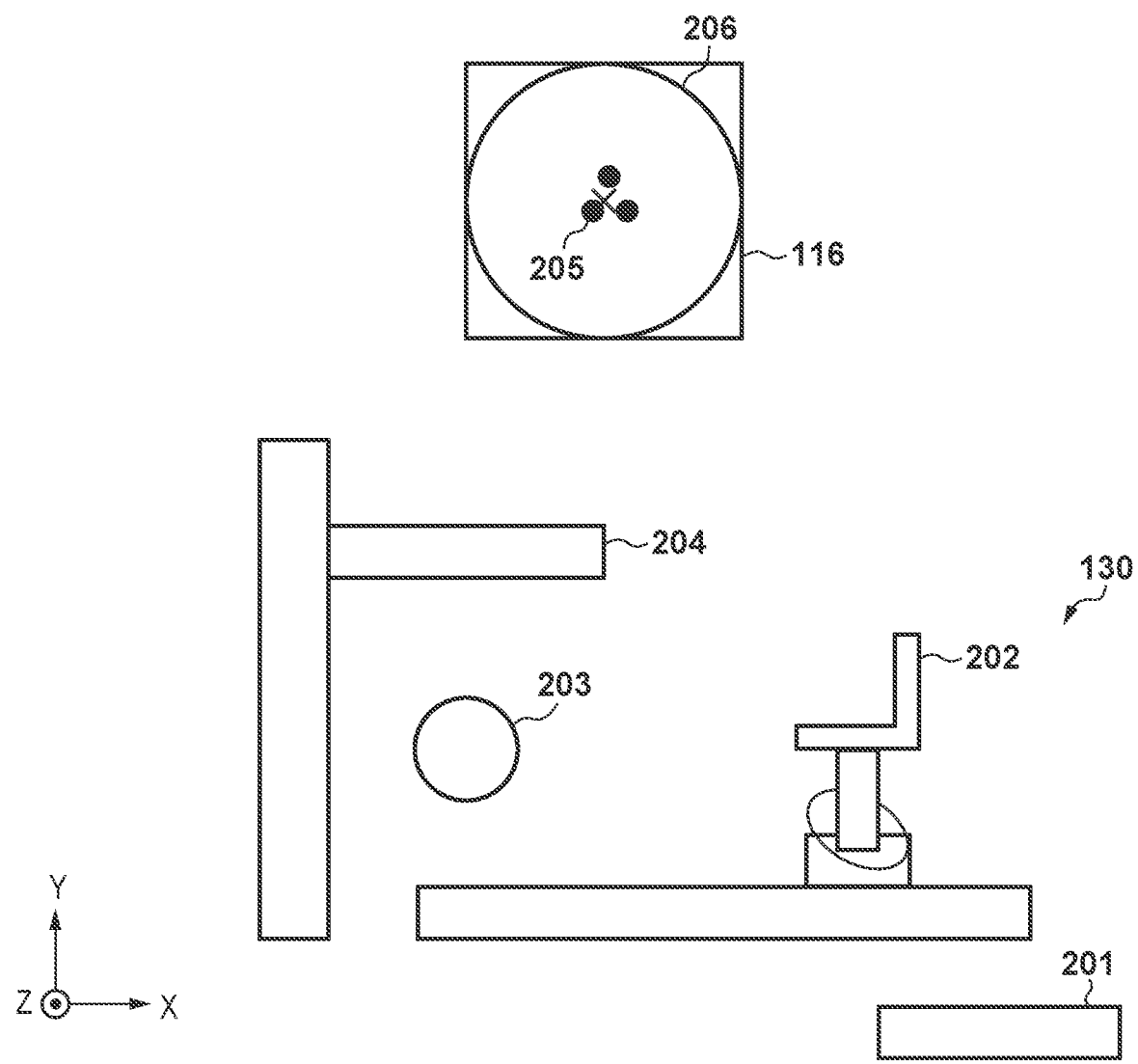
FIG. 2 is a schematic plan view showing the arrangements of a substrate stage and a conveying unit.

The conveying unit 130 is a conveying mechanism for holding and conveying the substrate 115 between the conveying unit 130 and the substrate stage 116. As shown in FIG. 2, the conveying unit 130 includes a conveying port 201, a first substrate hand 202, a pre-alignment unit 203, and a second substrate hand 204. The details of the conveying unit 130 will be described later together with the conveyance of the substrate 115 between the substrate stage 116 and the conveying unit 130. FIG. 2 is a schematic plan view showing the arrangements of the substrate stage 116 and the conveying unit 130.

A storage unit 123 stores various types of programs, data, and the like required to operate the exposure apparatus 1. In this embodiment, the storage unit 123 also functions as an accumulation unit that stores and accumulates control information concerning the substrate stage 116 and the conveying unit 130 which is generated as a result of processing the substrate 115 in the exposure apparatus 1. In this case, the control information includes holding forces with which the substrate stage 116 and the conveying unit 130 hold the substrate 115 and the times required for the substrate stage 116 and the conveying unit 130 to hold the substrate 115 with preset holding forces. In addition, the control information includes measurement values concerning the alignment of the substrate 115 when it is conveyed between the substrate stage 116 and the conveying unit 130 and the number of alignment errors. Note, however, the control information need not always include all the above information and may include at least one piece of the above information.

The main control unit 103 is formed from an information processing apparatus (computer), and comprehensively controls the respective units of the exposure apparatus 1 via the illumination system control unit 108, the projection system control unit 114, and the stage control unit 120 in accordance with programs stored in the storage unit 123. The main control unit 103 controls exposure processing of forming a pattern on the substrate 115 by exposing the substrate 115 via the mask 109. In addition, in this embodiment, the main control unit 103 functions as a determination unit that determines a conveying procedure when conveying the substrate 115 between the substrate stage 116 and the conveying unit 130 based on control information accumulated in the storage unit 123.

The conveyance of the substrate 115 between the substrate stage 116 and the conveying unit 130 will be described with reference to FIG. 2. The substrate stage 116 is provided with a chuck 206 that holds the substrate 115 on a holding surface. The substrate stage 116 is also provided with lifting pins 205 that are moved up and down by a drive unit (not shown) with respect to the holding surface on which the chuck 206 holds the substrate 115. Note that the chuck 206 may be moved up and down by a drive unit (not shown), instead of the lifting pins 205, to move the lifting pins 205 up and down relative to the holding surface of the chuck 206.

Loading processing concerning the loading of the substrate 115 will be described first. In a device manufacturing factory, the substrate 115 is loaded into the exposure apparatus 1 via the conveying port 201 connecting the exposure apparatus 1 to an external apparatus. The first substrate hand 202 conveys the substrate 115 loaded into the exposure apparatus 1 to the pre-alignment unit 203 that performs pre-alignment (coarse positioning) of the substrate 115. The second substrate hand 204 conveys the substrate 115 having undergone pre-alignment by the pre-alignment unit 203 to the substrate stage 116. At this time, the substrate stage 116 has moved to a substrate loading position (first position) in advance. When the second substrate hand 204 transfers the substrate 115 to the substrate stage 116, the lifting pins 205 receive first the substrate 115 while the lifting pins 205 have risen above the holding surface of the chuck 206. The lifting pins 205 then move downward to make the chuck 206 hold (transfer) the substrate 115 received by the lifting pins 205. The first substrate hand 202, the pre-alignment unit 203, the second substrate hand 204, the lifting pins 205, and the chuck 206 each hold the substrate 115 by, for example, vacuum suction. The chuck 206 completes loading processing by holding the substrate 115.

Unloading processing concerning the unloading of the substrate 115 will be described next. When exposure processing for the substrate 115 is completed, the substrate stage 116 holding the substrate 115 moves to a substrate unloading position (first position). When the substrate stage 116 transfers the substrate 115 to the first substrate hand 202, the lifting pins 205 move upward first on the substrate stage 116 to transfer the substrate 115 from the chuck 206 to the lifting pins 205. The substrate 115 held by the lifting pins 205 is then transferred to the first substrate hand 202. The first substrate hand 202 conveys the substrate 115 to the conveying port 201. The unloading processing is completed by unloading the substrate 115 from the conveying port 201.

First Embodiment

Figure 3:
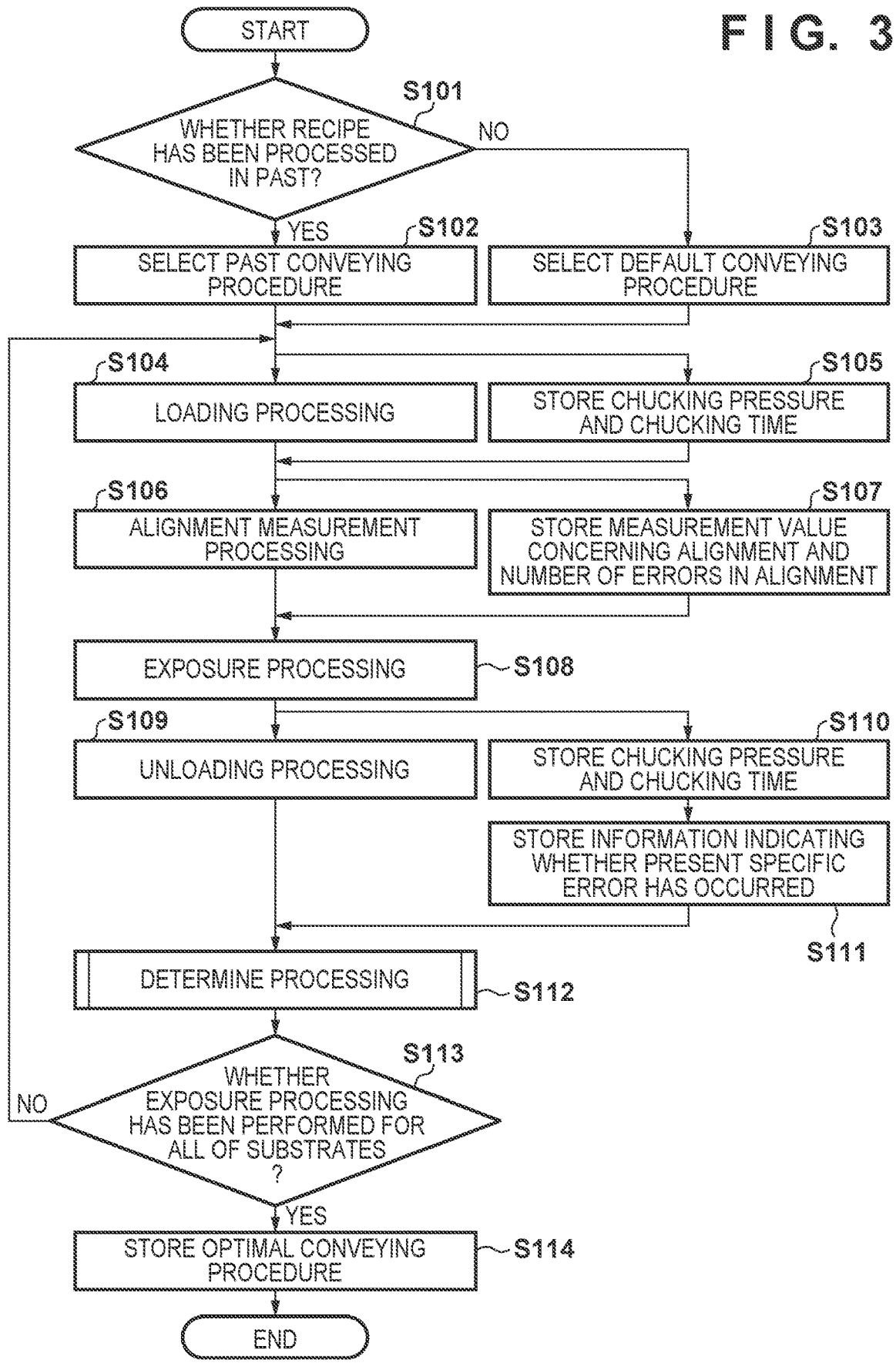
FIG. 3 is a flowchart for explaining the operation of the exposure apparatus.

The operation of the exposure apparatus 1 will be described with reference to FIG. 3. In step S101, the exposure apparatus 1 determines whether a recipe (process) for a target lot (a plurality of substrates included in a lot) loaded into the exposure apparatus 1 is the one processed in the past. If the recipe for the target lot is the one processed in the past, the process shifts to step S102. If the recipe for the target lot is not the one processed in the past, the process shifts to step S103.

In step S102, when the same recipe as that for the target lot is processed as a conveying procedure at the time of the conveyance of a substrate 115 between a substrate stage 116 and a conveying unit 130, the exposure apparatus 1 selects the conveying procedure (past conveying procedure) stored in a storage unit 123 in association with the recipe.

In step S103, the exposure apparatus 1 selects a conveying procedure (default conveying procedure) set by default as a conveying procedure when conveying the substrate 115 between the substrate stage 116 and the conveying unit 130.

In this embodiment, as conveying procedures at the time of the conveyance of the substrate 115 between the substrate stage 116 and the conveying unit 130, a plurality of conveying procedures that can be set for the substrate stage 116 and the conveying unit 130 are stored in the storage unit 123. For example, the storage unit 123 stores first and second conveying procedures as the plurality of conveying procedures. Assume that in this case, the first conveying procedure (to be referred to as the "productivity-oriented procedure" hereinafter) prioritizes productivity concerning the conveyance of the substrates 115 more than the second conveying procedure. The second conveying procedure (to be referred to as the "stability-oriented procedure" hereinafter) prioritizes stability concerning the conveyance of the substrates 115 more than the first conveying procedure. The default conveying procedure may be the productivity-oriented procedure. Note that in the embodiment, the plurality of conveying procedures are two types of conveying procedures. However, this is not exhaustive. In addition, a default conveying procedure may be settable with parameters.

In step S104, the exposure apparatus 1 performs loading processing of loading the substrate 115 into the exposure apparatus 1. The loading processing is the same as that described with reference to FIG. 2, and hence a detailed description of the processing will be omitted.

In step S105, the exposure apparatus 1 stores, in the storage unit 123, control information concerning the substrate stage 116 and the conveying unit 130, which is generated as a result of loading the substrate 115. More specifically, the storage unit 123 stores chucking pressures (holding forces) with which lifting pins 205 and a chuck 206 hold the substrate 115 and the chucking times required for the lifting pins 205 and the chuck 206 to hold the substrate 115 with preset chucking pressures.

In step S106, the exposure apparatus 1 performs alignment measurement processing. The alignment measurement processing is processing concerning the alignment of the substrate 115 which is performed when the substrate 115 is conveyed between the substrate stage 116 and the conveying unit 130. The alignment measurement processing is processing for measuring a positional shift of the substrate 115.

More specifically, the alignment measurement processing includes the processing of measuring a positional shift between the substrate 115 and the substrate stage 116 and the processing of measuring a positional shift between a mask 109 and the substrate 115.

In step S107, the exposure apparatus 1 stores, in the storage unit 123, control information concerning the substrate stage 116 and the conveying unit 130 which is generated by aligning the substrate 115. More specifically, the storage unit 123 stores measurement values concerning the alignment of the substrate 115 which is performed when the substrate 115 is conveyed between the substrate stage 116 and the conveying unit 130 and the number of errors in the alignment.

In step S108, the exposure apparatus 1 performs exposure processing of forming a pattern on the substrate 115 by exposing the substrate 115 via the mask 109 while controlling the relative position between the mask 109 and the substrate 115 in accordance with the alignment measurement processing performed in step S106.

In step S109, the exposure apparatus 1 performs unloading processing of unloading the substrate 115 from the exposure apparatus 1. The unloading processing is the same as that described with reference to FIG. 2, and hence a detailed description of the processing will be omitted.

In step S110, the exposure apparatus 1 stores, in the storage unit 123, control information concerning the substrate stage 116 and the conveying unit 130 which is generated as a result of unloading the substrate 115. More specifically, the storage unit 123 stores chucking pressures (holding forces) with which the lifting pins 205 and the chuck 206 hold the substrate 115 and the chucking times required for the lifting pins 205 and the chuck 206 to hold the substrate 115 with preset chucking pressures.

In step S111, the exposure apparatus 1 stores information indicating whether preset specific errors have occurred. In this case, the specific errors include, for example, a chucking error, that is, a failure in chucking the substrate 115 by the lifting pins 205 or the chuck 206.

In step S112, the exposure apparatus 1 performs determination processing of determining a conveying procedure when conveying the substrate 115 between the substrate stage 116 and the conveying unit 130. The details of the determination processing will be described later with reference to FIG. 4.

In step S113, the exposure apparatus 1 determines whether exposure processing has been performed for all the substrates 115 included in a lot. If exposure processing has not been performed for all the substrates 115 included in the lot, the process shifts to step S104 to perform exposure processing for the next substrate 115. If exposure processing has been performed for all the substrates 115 included in the lot, the process shifts to step S114.

In step S114, the exposure apparatus 1 stores, in the storage unit 123, an optimal conveying procedure (that is, the conveying procedure selected in step S102 or S103 or the conveying procedure determined in step S112) for a recipe for the target lot input in step S101 in association with the recipe.

Figure 4A:
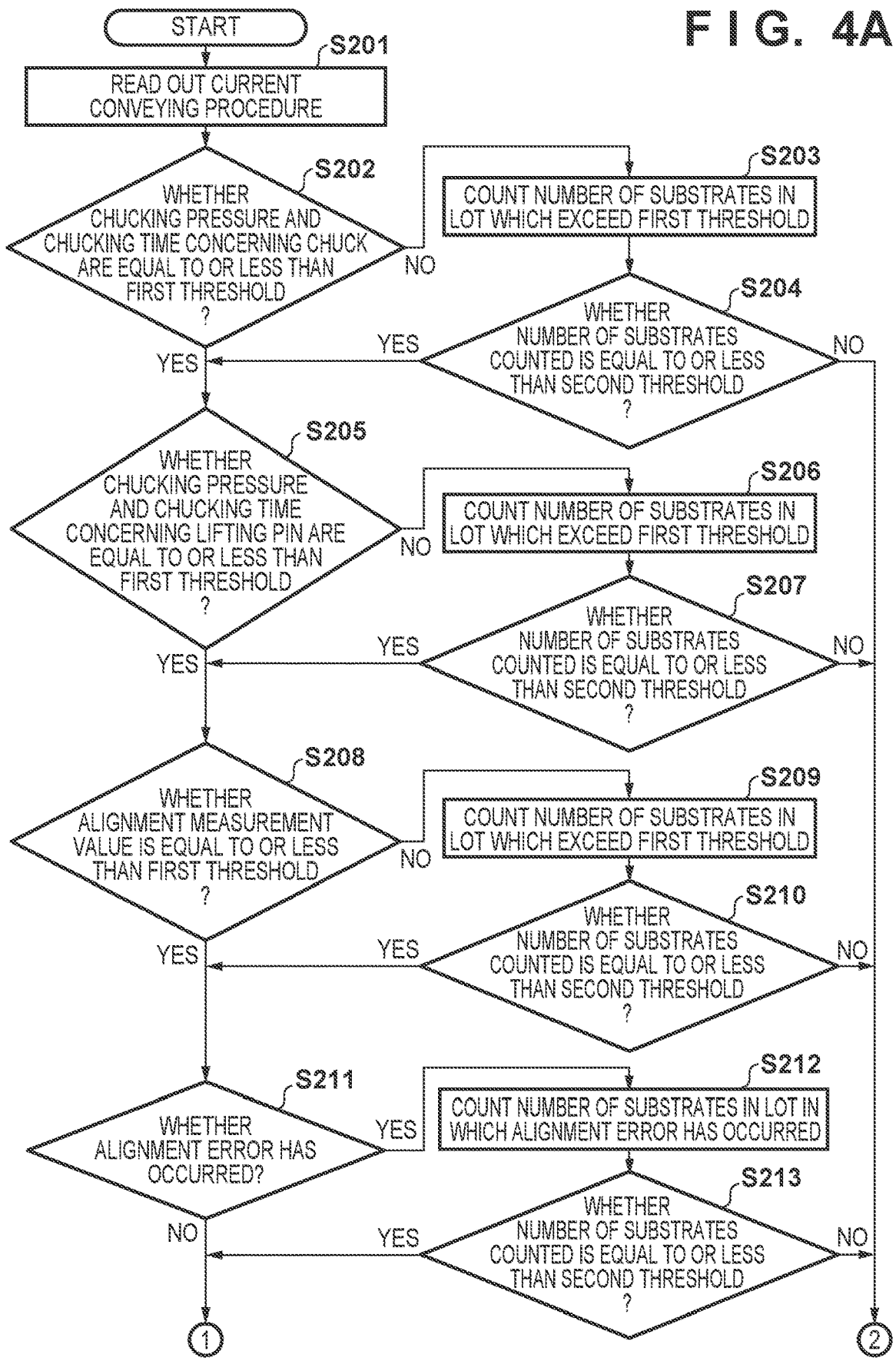
FIGS. 4A and 4B are flowcharts for explaining the details of determination processing (step S112) shown in FIG. 3.
Figure 4B:
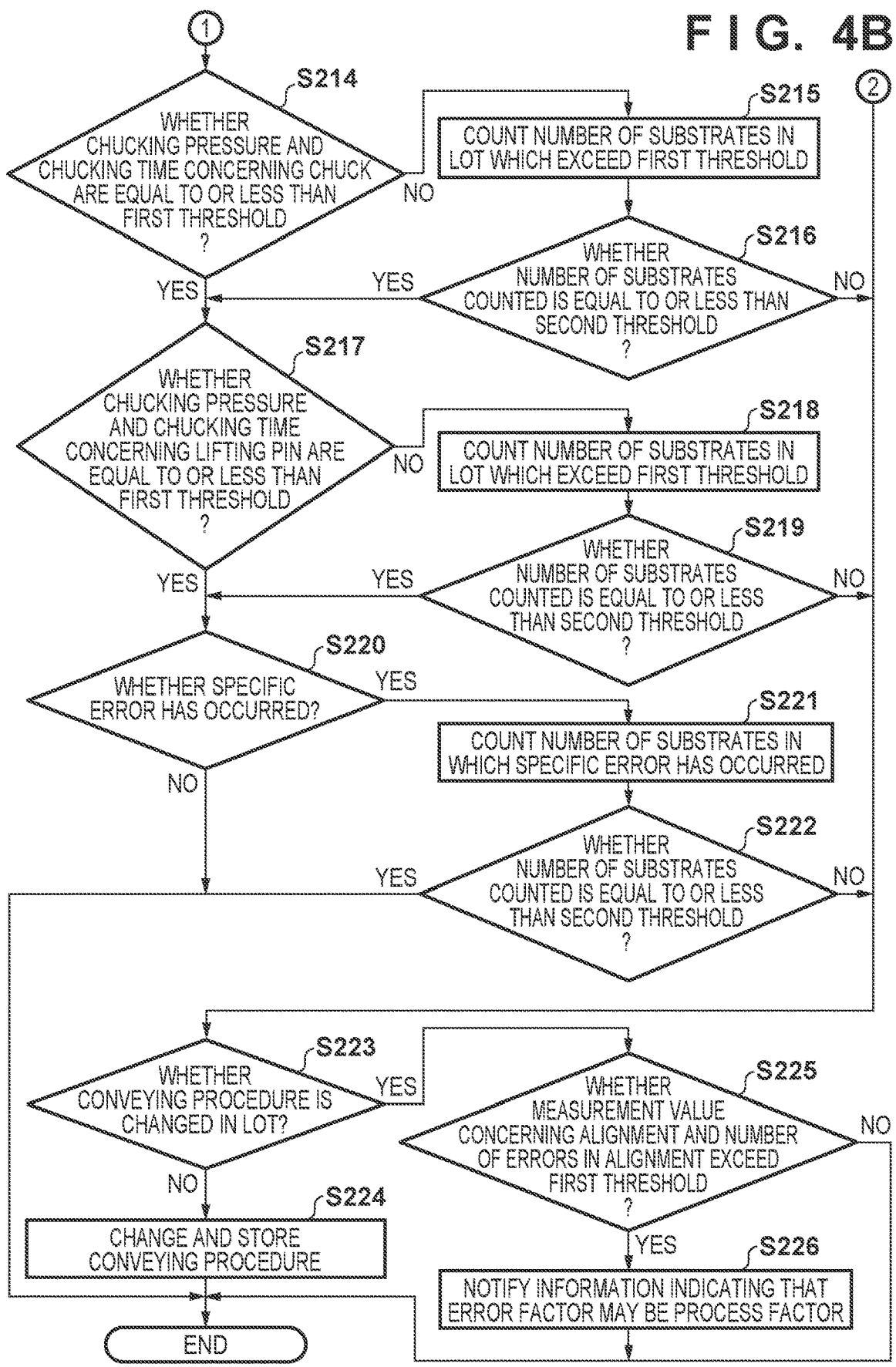

The details of determination processing (step S112) of determining a conveying procedure when conveying the substrate 115 between the substrate stage 116 and the conveying unit 130 will be described with reference to FIGS. 4A and 4B. In the following description, the threshold set for each control information accumulated (stored) in the storage unit 123 is set as the first threshold, and the threshold set for the number of substrates 115 in the lot which exceed the first threshold is set as the second threshold.

In step S201, the exposure apparatus 1 reads out a conveying procedure stored in the storage unit 123. In step S202, the exposure apparatus 1 determines whether the chucking pressure and the chucking time concerning the chuck 206 in the loading processing which are stored in the storage unit 123 in step S105 are equal to or less than the first thresholds set for them. If the chucking force and the chucking time concerning the chuck 206 are not equal to or less than the first thresholds, the process shifts to step S203. If the chucking force and the chucking time concerning the chuck 206 are equal to or less than the first thresholds, the process shifts to step S205.

In step S203, the exposure apparatus 1 counts the number of substrates 115 in the lot which exceed the first thresholds in terms of the chucking pressure and the chucking time concerning the chuck 206 in the loading processing. In step S204, the exposure apparatus 1 determines whether the number of substrates 115 counted in step S203 is equal to or less than the second threshold set for it. If the number of substrates 115 counted in step S203 is not equal to or less than the second threshold, the process shifts to step S223. If the number of substrates 115 counted in step S203 is equal to or less than the second threshold, the process shifts to step S205.

In step S223, the exposure apparatus 1 determines whether the conveying procedure is changed (determined) in the lot. If the conveying procedure is not changed in the lot, the process shifts to step S224. If the conveying procedure is changed in the lot, the process shifts to step S225.

In step S224, the exposure apparatus 1 changes (determines) the conveying procedure and stores the conveying procedure in the storage unit 123. In this embodiment, if, for example, the current conveying procedure is a productivity-oriented procedure, the conveying procedure is changed to a stability-oriented procedure for the following reason. If the conveying procedure is a productivity-oriented procedure, it is necessary to perform recovery processing for an error, resulting in a deterioration in productivity. Accordingly, changing the conveying procedure to a stability-oriented procedure prioritizing stability will improve the productivity. As disclosed in Japanese Patent Laid-Open No. 2006-269867, the exposure apparatus 1 may change drive parameters and the first thresholds concerning the respective units of the substrate stage 116 and the conveying unit 130 as well as changing the conveying procedure.

In step S225, the exposure apparatus 1 determines whether measurement values concerning alignment and the number of errors in alignment exceed the first thresholds set for them. If the measurement values concerning alignment and the number of errors in alignment exceed the first thresholds, the process shifts to step S226 to notify the corresponding information, for example, information indicating that the error factor may be a process (lot) factor. In other words, if the conveying procedure is changed and the measurement values concerning alignment and the number of errors in alignment do not change before and after the change in conveying procedure, the exposure apparatus 1 notifies the corresponding information. Such notification is performed via, for example, the display or audio output device of the exposure apparatus 1, and hence the display or audio output device functions as a notification unit.

In step S205, the exposure apparatus 1 determines whether the chucking pressure and the chucking time concerning the lifting pins 205 in loading processing which are stored in the storage unit 123 in step S105 are equal to or less than the first thresholds set for them. If the chucking pressure and the chucking time concerning the lifting pins 205 are not equal to or less than the first thresholds, the process shifts to step S206. If the chucking pressure and the chucking time concerning the lifting pins 205 are equal to or less than the first thresholds, the process shifts to step S208.

In step S206, the exposure apparatus 1 counts the number of substrates 115 in the lot which exceed the first thresholds concerning the chucking pressure and the chucking time concerning the lifting pins 205 in the loading processing. In step S207, the exposure apparatus 1 determines whether the number of substrates 115 counted in step S206 is equal to or less than the second threshold set for it. If the number of substrates 115 counted in step S206 is not equal to or less than the second threshold, the process shifts to step S223. If the number of substrates 115 counted in step S206 is equal to or less than the second threshold, the process shifts to step S208.

In step S208, the exposure apparatus 1 determines whether the alignment measurement value in alignment measurement processing which is stored in the storage unit 123 in step S107 is equal to or less than the first threshold set for the alignment measurement value. If the alignment measurement value is not equal to or less than the first threshold, the process shifts to step S209. If the alignment measurement value is equal to or less than the first threshold, the process shifts to step S211.

In step S209, the exposure apparatus 1 counts the number of substrates 115 in the lot which exceed the first threshold concerning the alignment measurement value. In step S210, the exposure apparatus 1 determines whether the number of substrates 115 counted in step S209 is equal to or less than the second threshold set for the number of substrates. If the number of substrates 115 counted in step S209 is not equal to or less than the second threshold, the process shifts to step S223. If the number of substrates 115 counted in step S209 is equal to or less than the second threshold, the process shifts to step S211.

In step S211, the exposure apparatus 1 determines whether an alignment error has occurred, based on the number of alignment errors in the alignment measurement processing which is stored in the storage unit 123 in step S107. If an alignment error has occurred, the process shifts to step S212. If no alignment error has occurred, the process shifts to step S214.

In step S212, the exposure apparatus 1 counts the number of substrates 115 in the lot in which alignment errors have occurred concerning the number of alignment errors. In step S213, the exposure apparatus 1 determines whether the number of substrates 115 counted in step S212 is equal to or less than the second threshold set for the number of substrates. If the number of substrates 115 counted in step S212 is not equal to or less than the second threshold, the process shifts to step S223. If the number of substrates 115 counted in step S212 is equal to or less than the second threshold, the process shifts to step S214.

In step S214, the exposure apparatus 1 determines whether the chucking pressure and the chucking time concerning the chuck 206 in the unloading processing which are stored in the storage unit 123 in step S110 are equal to or less than the first thresholds set for them. If the chucking pressure and the chucking time concerning the chuck 206 are not equal to or less than the first thresholds, the process shifts to step S215. If the chucking pressure and the chucking time concerning the chuck 206 are equal to or less than the first thresholds, the process shifts to step S217.

In step S215, the exposure apparatus 1 counts the number of substrates 115 in the lot which exceed the first threshold concerning the chucking pressure and the chucking time concerning the chuck 206 in the unloading processing. In step S216, the exposure apparatus 1 determines whether the number of substrates 115 counted in step S215 is equal to or less than the second threshold. If the number of substrates 115 counted in step S215 is not equal to or less than the second threshold, the process shifts to step S223. If the number of substrates 115 counted in step S215 is equal to or less than the second threshold, the process shifts to step S217.

In step S217, the exposure apparatus 1 determines whether the chucking pressure and the chucking time concerning the lifting pins 205 in the unloading processing which are stored in the storage unit 123 in step S110 are equal to or less than the first thresholds set for them. If the chucking pressure and the chucking time concerning the lifting pins 205 are not equal to or less than the first thresholds, the process shifts to step S218. If the chucking pressure and the chucking time concerning the lifting pins 205 are equal to or less than the first thresholds, the process shifts to step S220.

In step S218, the exposure apparatus 1 counts the number of substrates 115 in the lot which exceed the first thresholds concerning the chucking pressure and the chucking time concerning the lifting pins 205 in the unloading processing. In step S219, the exposure apparatus 1 determines whether the number of substrates 115 counted in step S218 is equal to or less than the second threshold set for the number of substrates. If the number of substrates 115 counted in step S218 is not equal to or less than the second threshold, the process shifts to step S223. If the number of substrates 115 counted in step S218 is equal to or less than the second threshold, the process shifts to step S220.

In step S220, the exposure apparatus 1 determines whether a specific error has occurred, based on information indicating the presence/absence of the specific error which is stored in the storage unit 123 in step S111. If the specific error has occurred, the process shifts to step S221. If the specific error has not occurred, the determination processing is terminated.

In step S221, the exposure apparatus 1 counts the number of substrates 115 in the lot in which specific errors have occurred. In step S222, the exposure apparatus 1 determines whether the number of substrates 115 counted in step S221 is equal to or less than the second threshold set for the number of substrates. If the number of substrates 115 counted in step S221 is not equal to or less than the second threshold, the process shifts to step S223. Note that with regard to a specific error, the exposure apparatus 1 changes, for example, the first thresholds for the chucking pressures of the chuck 206 and the lifting pins 205 in step S224. If the number of substrates 115 counted in step S221 is equal to or less than the second threshold, the determination processing is terminated.

A productivity-oriented procedure as one of conveying procedures in this embodiment will be described with reference to FIG. 5. In step S301, the substrate 115 is loaded into the exposure apparatus 1 via a conveying port 201. In step S302, a first substrate hand 202 conveys (moves) the substrate 115 loaded into the exposure apparatus 1 to a pre-alignment unit 203. In step S303, the pre-alignment unit 203 transfers the substrate 115 to the second substrate hand 204. In step S304, the substrate 115 is transferred from a second substrate hand 204 to the lifting pins 205 at a substrate loading position.

In step S305, the exposure apparatus 1 moves the second substrate hand 204 in the Y-axis minus direction to make the second substrate hand 204 retract from the substrate loading position. In step S306, the exposure apparatus 1 moves the substrate stage 116 in the Y-axis plus direction to make the substrate stage 116 retract to a non-interference region where the substrate stage 116 does not interfere with the second substrate hand 204 that has been made to retract in step S305. In step S307, the exposure apparatus 1 moves the substrate stage 116 in the Z-axis plus direction to drive the substrate stage 116 to a front interference region where the substrate stage 116 interferes with the second substrate hand 204.

In the productivity-oriented procedure, the exposure apparatus 1 concurrently performs steps S305, S306, and S307 in this manner. In other words, the productivity-oriented procedure is a procedure for concurrently performing a procedure for making the conveying unit 130 retract from the substrate loading position after the conveying unit 130 transfers the substrate 115 to the substrate stage 116 at the substrate loading position and a procedure for making the substrate stage 116 retract from the substrate loading position. This improves productivity concerning the loading of substrates 115.

After the completion of the concurrent processing of steps S305, S306, and S307, the lifting pins 205 transfer the substrate 115 to the chuck 206 in step S308. Thus, the exposure apparatus 1 terminates the conveying procedure prioritizing productivity.

A stability-oriented procedure as one of the conveying procedures in this embodiment will be described with reference to FIG. 6. In step S401, the substrate 115 is loaded into the exposure apparatus 1 via the conveying port 201. In step S402, the first substrate hand 202 conveys (moves) the substrate 115 loaded into the exposure apparatus 1 to the pre-alignment unit 203. In step S403, the pre-alignment unit 203 transfers the substrate 115 to the second substrate hand 204. In step S404, the second substrate hand 204 transfers the substrate 115 to the lifting pins 205 at the substrate loading position.

In step S405, the exposure apparatus 1 moves the second substrate hand 204 in the Y-axis minus direction to make the second substrate hand 204 retract from the substrate loading position. In step S406, the exposure apparatus 1 moves the substrate stage 116 in the Z-axis plus direction to drive the substrate stage 116 to an interference region where the substrate stage 116 interferes with the second substrate hand 204.

In this manner, in the stability-oriented procedure, the exposure apparatus 1 inhibits the movement of the substrate stage 116 while the lifting pins 205 hold the substrate 115. In other words, the stability-oriented procedure is a procedure for sequentially performing a procedure for making the conveying unit 130 retract from the substrate loading position after the conveying unit 130 transfers the substrate 115 to the substrate stage 116 at the substrate loading position and a procedure for making the substrate stage 116 retract from the substrate loading position. This improves stability concerning the loading of substrates 115.

After the completion of the processing in steps S405 and S406, the lifting pins 205 transfer the substrate 115 to the chuck 206 in step S407. Thus, the exposure apparatus 1 terminates the conveying procedure prioritizing stability.

This embodiment has exemplified the conveying procedure used when the substrate 115 is loaded. However, the present invention can also be applied to a conveying procedure when the substrate 115 is unloaded. A conveying procedure prioritizing productivity and a conveying procedure prioritizing stability at the time of unloading the substrate 115 will be described below.

A conveying procedure prioritizing productivity when unloading the substrate 115 will be described with reference to FIG. 7. In step S501, the chuck 206 transfers the substrate 115 to the lifting pins 205. In step S502, the exposure apparatus 1 moves the substrate stage 116 in the Z-axis minus direction to drive the substrate stage 116 to a non-interference region where the substrate stage 116 does not interfere with the first substrate hand 202.

In step S503, the exposure apparatus 1 moves the substrate stage 116 to drive the substrate stage 116 to a substrate unloading position. In step S504, the exposure apparatus 1 moves the first substrate hand 202 in the Y-axis plus direction to drive the first substrate hand 202 to the substrate unloading position.

In this manner, in the conveying procedure prioritizing productivity, the exposure apparatus 1 concurrently performs steps S503 and S504. In other words, this conveying procedure is a procedure for concurrently performing a procedure for moving the substrate stage 116 to the substrate unloading position before the conveying unit 130 receives the substrate 115 from the substrate stage 116 at the substrate unloading position and a procedure for moving the conveying unit 130 to the substrate unloading position. This improves productivity concerning the unloading of the substrates 115.

After the completion of the concurrent processing in steps S503 and S504, the lifting pins 205 transfer the substrate 115 to the first substrate hand 202 in step S505. In step S506, the substrate 115 is unloaded from the exposure apparatus 1 through the conveying port 201. Thus, the exposure apparatus 1 terminates the conveying procedure prioritizing productivity when unloading the substrate 115.

A conveying procedure prioritizing stability when unloading the substrate 115 will be described with reference to FIG. 8. In step S601, the exposure apparatus 1 moves the substrate stage 116 to drive the substrate stage 116 to the substrate unloading position. In step S602, the chuck 206 transfers the substrate 115 to the lifting pins 205. In step S603, the exposure apparatus 1 moves the substrate stage 116 in the Z-axis minus direction to drive the substrate stage 116 to a non-interference region where the substrate stage 116 does not interfere with the first substrate hand 202. In step S604, the exposure apparatus 1 moves the first substrate hand 202 in the Y-axis plus direction to drive the first substrate hand 202 to a substrate conveying position.

In this manner, in the conveying procedure prioritizing stability, the exposure apparatus 1 inhibits the movement of the substrate stage 116 while the lifting pins 205 hold the substrate 115. In other words, this conveying procedure is a procedure for sequentially performing a procedure for moving the substrate stage 116 to the substrate unloading position before the conveying unit 130 receives the substrate 115 from the substrate stage 116 at the substrate unloading position and a procedure for moving the conveying unit 130 to the substrate unloading position. This improves stability concerning the unloading of the substrates 115.

In step S605, the lifting pins 205 transfer the substrate 115 to the first substrate hand 202. In step S606, the substrate 115 is unloaded from the exposure apparatus 1 through the conveying port 201. Thus, the exposure apparatus 1 terminates the conveying procedure prioritizing stability when unloading the substrate 115.

In this manner, in this embodiment, the exposure apparatus 1 determines (changes) a conveying procedure when conveying the substrate 115 between the substrate stage 116 and the conveying unit 130 based on control information concerning the substrate stage 116 and the conveying unit 130 which is generated as a result of conveying the substrate 115. In this case, the exposure apparatus 1 determines a conveying procedure when conveying the substrate 115 by selecting one of the plurality of conveying procedures stored in the storage unit 123 based on each control information and the result of comparison between each control information and a threshold set for each control information. In the embodiment, while continuously processing the plurality of substrates 115 included in the same lot, the exposure apparatus 1 determines a conveying procedure when conveying the substrate 115 between the substrate stage 116 and the conveying unit 130. However, the exposure apparatus 1 may also determine a conveying procedure when conveying the substrate 115 between the substrate stage 116 and the conveying unit 130 for each lot or each preset number of substrates. According to the embodiment, it is possible to automatically determine (change) an optimal conveying procedure for conveying the substrate 115 between the substrate stage 116 and the conveying unit 130 in accordance with a process. This makes it possible to improve productivity while maintaining stability.

An example of a specific effect of the determination processing shown in FIG. 4 will be described. When, for example, the current chucking pressure is lower than the chucking pressure stored (accumulated) in the storage unit 123 or the current chucking time is shorter than the chucking time stored (accumulated) in the storage unit 123, it is estimated that the amount of warpage of the substrate 115 is large or the flatness of the reverse surface of the substrate 115 is low. Assume that the exposure apparatus 1 conveys the substrate 115 according to the productivity-oriented procedure. In this case, when the exposure apparatus 1 moves the substrate stage 116 while the lifting pins 205 hold the substrate 115 (step S306), the positional shift of the substrate 115 can occur. In addition, the substrate 115 may drop from the lifting pins 205. In such a case, the exposure apparatus 1 selects the stability-oriented procedure because the stability-oriented procedure can improve productivity concerning the conveyance of the substrates 115 more than the productivity-oriented procedure.

A measurement value concerning alignment and the number of errors in alignment are used when the chucking pressure and the chucking time are similar to the chucking pressure and the chucking time stored (accumulated) in the storage unit 123. If the measurement value concerning alignment is an abnormal value or an alignment error has occurred, it is estimated that the contact surface between the substrate 115 and the lifting pins 205 has been contaminated or physically defected. In such a case, the exposure apparatus 1 selects the stability-oriented procedure because the stability-oriented procedure can improve productivity concerning the conveyance of the substrates 115 more than the productivity-oriented procedure.

The exposure apparatus 1 may further include a user interface 150 that provides the user with a setting screen for setting first and second thresholds. FIG. 9 shows an example of a setting screen 701 for setting first and second thresholds which is provided (displayed) on a display or touch panel as the user interface 150. A main control unit 103 provides the user interface 150.

On the setting screen 701, a parameter 702 serves to set the first threshold for the chucking pressure of the chuck 206 in loading processing. A parameter 703 serves to set the second threshold concerning the number of substrates 115 for each of which the chucking pressure of the chuck 206 in loading processing exceeds the first threshold. A parameter 704 serves to set a conveying procedure to be determined (changed) when the second threshold is exceeded in the same lot.

A parameter 705 serves to set the first threshold for the chucking time of the chuck 206 in loading processing. A parameter 706 serves to set the second threshold concerning the number of substrates 115 for each of which the chucking time of the chuck 206 in loading processing exceeds the first threshold. A parameter 707 serves to set a conveying procedure to be determined (changed) when the second threshold is exceeded in the same lot.

A parameter 708 serves to set the first threshold for the chucking pressure of the lifting pins 205 in loading processing. A parameter 709 serves to set the second threshold concerning the number of substrates 115 for each of which the chucking pressure of the lifting pins 205 in loading processing exceeds the first threshold. A parameter 710 serves to set a conveying procedure to be determined (changed) when the second threshold is exceeded in the same lot.

A parameter 711 serves to set the first threshold for the chucking time of the lifting pins 205 in loading processing. A parameter 712 serves to set the second threshold concerning the number of substrates 115 for each of which the chucking time of the lifting pins 205 in loading processing exceeds the first threshold. A parameter 713 serves to set a conveying procedure to be determined (changed) when the second threshold is exceeded in the same lot.

A parameter 714 serves to set the first threshold for measurement values concerning alignment. Note that a plurality of first thresholds may be set for measurement values concerning alignment. For example, the first thresholds may be respectively set for the X-axis, the Y-axis, and the rotational axis. A parameter 715 serves to set the second threshold concerning the number of substrates 115 for each of which a measurement value concerning alignment exceeds the first threshold. A parameter 716 serves to set a conveying procedure to be determined (changed) when the second threshold is exceeded in the same lot.

A parameter 717 serves to set the second threshold for the number of alignment errors. A parameter 718 serves to set a conveying procedure to be determined (changed) when the second threshold is exceeded in the same lot.

A parameter 719 serves to set the first threshold for the chucking pressure of the chuck 206 in unloading processing. A parameter 720 serves to set the second threshold concerning the number of substrates 115 for each of which the chucking pressure of the chuck 206 in unloading processing exceeds the first threshold. A parameter 721 serves to set a conveying procedure to be determined (changed) when the second threshold is exceeded in the same lot.

A parameter 722 serves to set the first threshold for the chucking time of the chuck 206 in unloading processing. A parameter 723 serves to set the second threshold concerning the number of substrates 115 for each of which the chucking time of the chuck 206 in unloading processing exceeds the first threshold. A parameter 724 serves to set a conveying procedure to be determined (changed) when the second threshold is exceeded in the same lot.

A parameter 725 serves to set the first threshold for the chucking pressure of the lifting pins 205 in unloading processing. A parameter 726 serves to set the second threshold concerning the number of substrates 115 for each of which the chucking pressure of the lifting pins 205 in unloading processing exceeds the first threshold. A parameter 727 serves to set a conveying procedure to be determined (changed) when the second threshold is exceeded in the same lot.

A parameter 728 serves to set the first threshold for the chucking time of the lifting pins 205 in unloading processing. A parameter 729 serves to set the second threshold concerning the number of substrates 115 for each of which the chucking time of the lifting pins 205 in unloading processing exceeds the first threshold. A parameter 730 serves to set a conveying procedure to be determined (changed) when the second threshold is exceeded in the same lot.

A parameter 731 serves to set an error number corresponding to a specific error. A parameter 732 serves to set the second threshold concerning the number of substrates 115 having undergone a specific error. A parameter 733 serves to set a conveying procedure to be determined (changed) when the second threshold is exceeded in the same lot.

A parameter 734 serves to set a default conveying procedure.

Second Embodiment

The first embodiment has exemplified the case in which a conveying procedure is determined (changed) by using each threshold set for each piece of control information. However, this is not exhaustive. For example, a conveying procedure may be determined (changed) by using a learning model obtained by machine learning.

In the second embodiment, first of all, learning data indicating the relationship between input data and teacher data is prepared. In this case, the input data is data including at least one of a measurement value concerning a chucking pressure, chucking time, or alignment and the number of alignment errors. The teacher data is data indicating a proper conveying procedure for input data. The data indicating a proper conveying procedure can be data indicating two values respectively representing being proper and improper. Note that as data indicating a proper conveying procedure, data indicating a value (for example, a natural number from 1 to 10) representing a stepwise evaluation of properness or data indicating the probability (for example, a real number from 0 to 1) of being proper.

It is possible to obtain input data such as measurement values concerning chucking pressures, chucking times, and alignment and the number of alignment errors by usual substrate processing. A conveying procedure as output data can be derived by calculating statistics from each input data (control information) accumulated in a storage unit 123 and productivity. It is also possible to derive a conveying procedure from an experiment of obtaining each input data by processing various types of substrates 115 and comparing productivities.

A learning model for determining a proper conveying procedure is obtained by using learning data. Learning data can be obtained by using, for example, a neural network. The neural network is a model having a multilayer network structure including an input layer, an intermediate layer, and an output layer. It is possible to obtain a learning data by optimizing random variables inside the network by an algorithm such as a backpropagation method using learning data indicating the relationship between input data and teacher data. This embodiment has exemplified the case in which a learning model is obtained by using a neural network. However, this is not exhaustive. For example, other models and algorithms such as a support vector machine and a determination tree may be used.

Inputting new input data to the obtained learning model will output data indicating a proper conveying procedure as output data. A proper conveying procedure can be determined based on the output data.

Note that the first embodiment and the second embodiment can be selectively executed. In other words, setting can be made to determine a conveying procedure by using each threshold set for each piece of control information or determine a conveying procedure by using the learning model obtained by machine learning. For example, as shown in FIG. 10, two checkboxes 741 and 742 are provided on the setting screen 701 provided on the user interface 150. The checkbox 741 is a checkbox for selecting to determine a conveying procedure by using each threshold. The checkbox 742 is a checkbox for selecting to determine a conveying procedure by using a learning model.

Third Embodiment

An article manufacturing method according to an embodiment of the present invention is suitable for manufacturing an article, for example, a device (a semiconductor device, magnetic storage medium, liquid crystal element, or the like). This manufacturing method includes a step of forming a pattern on a substrate by using the exposure apparatus 1, a step of processing the substrate on which the pattern is formed, and a step of manufacturing an article from the processed substrate. This manufacturing method further includes other known steps (oxidation, deposition, vapor deposition, doping, planarization, etching, resist removal, dicing, bonding, packaging, and the like). The article manufacturing method according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2019-048747 filed on Mar. 15, 2019, which is hereby incorporated by reference herein in its entirety.

What is claimed is:

1. A determination method of determining a conveying procedure for conveying a substrate to be processed between a stage configured to hold and move the substrate to be processed and a convey unit configured to hold and convey the substrate to be processed between the conveying unit and the stage, the method comprising:
   accumulating control information concerning the stage and the conveying unit generated as a result of previous processing of a substrate that has already been processed; and
   determining the conveying procedure by selecting one of a plurality of conveying procedures which can be set for the stage and the conveying unit based on the control information accumulated in the accumulating.

2. The method according to claim 1, further comprising storing the plurality of conveying procedures,
   wherein the determining determines a conveying procedure when conveying the substrate to be processed by selecting one of the plurality of conveying procedures stored in the storing based on the control information accumulated in the accumulating.

3. The method according to claim 1, wherein the plurality of conveying procedures include a first conveying procedure and a second conveying procedure,
the first conveying procedure is a conveying procedure prioritizing productivity concerning conveyance of the substrate more than the second conveying procedure, and
the second conveying procedure is a conveying procedure prioritizing stability concerning conveyance of the substrate more than the first conveying procedure.

4. The method according to claim 3, wherein the first conveying procedure is a procedure in which the substrate is transferred from the conveying unit to the stage at a substrate loading position, from which the conveying unit and the stage are concurrently retracted, and
the second conveying procedure is a procedure in which the substrate is transferred from the conveying unit to the stage at a substrate loading position, from which the conveying unit and the stage are retracted one after the other.

5. The method according to claim 3, wherein the first conveying procedure is a procedure in which the substrate is transferred from the stage to the conveying unit at a substrate unloading position, to which the conveying unit and the stage are concurrently moved, and
the second conveying procedure is a procedure in which the substrate is transferred from the stage to the conveying unit at a substrate unloading position, to which the conveying unit and the stage are moved one after the other.

6. The method according to claim 1, wherein the control information includes at least one of a holding force with which each of the stage and the conveying unit holds the substrate, a time required for each of the stage and the conveying unit to hold the substrate with a preset holding force, a measurement value concerning alignment of the substrate which is performed when the substrate is conveyed between the stage and the conveying unit, and a number of errors in the alignment.

7. The method according to claim 6, wherein the determining determines a conveying procedure for conveying the substrate to be processed between the stage and the conveying unit based on a result of comparing each of the holding force, the time, the measurement value, and the number of errors in the alignment and a threshold set for each of the holding force, the time, the measurement value, and the number of errors in the alignment.

8. The method according to claim 7, further comprising providing a user with a setting screen for setting the threshold.

9. The method according to claim 1, wherein a plurality of substrates included in the same lot are continuously processed, and
the determining determines a conveying procedure when conveying the substrate between the stage and the conveying unit while the plurality of substrates are continuously processed.

10. The method according to claim 9, further comprising notifying corresponding information when a conveying procedure is changed at a time of conveying the substrate between the stage and the conveying unit during continuous processing of the plurality of substrates, and no change occurs in a measurement value concerning alignment of the substrate and the number of errors in the alignment do not change before and after the change of the conveying procedure.

11. An article manufacturing method comprising:
accumulating control information, generated as a result of previous processing of a substrate that has already been processed, concerning a stage configured to hold and move a substrate to be processed and a conveying unit hold and convey the substrate to be processed between the conveying unit and the stage; and
determining the conveying procedure by selecting one of a plurality of conveying procedures which can be set for the stage and the conveying unit based on the control information accumulated in the accumulating,
conveying the substrate to be processed between the conveying unit and the stage with the conveying procedure determined in the determining,
forming a pattern on the substrate to be processed conveyed in the conveying,
processing the substrate on which the pattern is formed in the forming; and
manufacturing an article from the processed substrate.

12. The method according to claim 11, further comprising projecting an image of a mask pattern on the substrate conveyed in the conveying.

* * * * *